United States Patent
Kengeri et al.

(10) Patent No.: US 7,733,687 B2
(45) Date of Patent: Jun. 8, 2010

(54) WAK DEVICES IN SRAM CELLS FOR IMPROVING VCCMIN

(75) Inventors: Subramani Kengeri, San Jose, CA (US); Bharath Upputuri, Santa Clara, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 85 days.

(21) Appl. No.: 12/034,416

(22) Filed: Feb. 20, 2008

(65) Prior Publication Data

US 2009/0207675 A1 Aug. 20, 2009

(51) Int. Cl.
*G11C 11/00* (2006.01)
(52) U.S. Cl. .................................... 365/154; 365/226
(58) Field of Classification Search ............... 365/154, 365/226
See application file for complete search history.

(56) References Cited

U.S. PATENT DOCUMENTS

2007/0018257 A1* 1/2007 Joshi ........................ 257/393
2007/0206404 A1* 9/2007 Yamagami .................. 365/154
2007/0236983 A1* 10/2007 Wang et al. ................. 365/154
2009/0073782 A1* 3/2009 Hanafi et al. ............. 365/189.09

OTHER PUBLICATIONS

Ohbayashi, S., et al., "A 65-nm SoC Embedded 6T-SRAM Designed for Manufacturability with Read and Write Operation Stabilizing Circuits," IEEE Journal of Solid-State Circuits, vol. 42, No. 4, Apr. 2007, pp. 820-829, IEEE.
Zhang, K., et al., "A 3-GHz 70-Mb SRAM in 65-nm CMOS Technology with Integrated Column-Based Dynamic Power Supply," IEEE Journal of Solid-State Circuits, vol. 41, No. 1, Jan. 2006, pp. 146-151, IEEE.

* cited by examiner

*Primary Examiner*—Hoai V Ho
(74) *Attorney, Agent, or Firm*—Slater & Matsil, L.L.P.

(57) ABSTRACT

A memory circuit includes a bit line; a word line; a first power supply node having a first power supply voltage; a first power supply line connected to the first power supply node; a second power supply node selected from a group consisting of a floating node and a node having a second power supply voltage lower than the first power supply voltage; a second power supply line configured to switch connections between the first and the second power supply nodes; a write-assist-keeper (WAK) device coupling the first and the second power supply lines; and a static random access memory (SRAM) cell connected to the bit line, the word line and the second power supply line.

27 Claims, 10 Drawing Sheets

WAK DEVICES IN SRAM CELLS FOR IMPROVING VCCMIN

TECHNICAL FIELD

This invention relates generally to semiconductor devices, and more particularly to memory arrays, and even more particularly to the design and operations of static random access memory (SRAM) arrays.

BACKGROUND

Static random access memory (SRAM) is commonly used in integrated circuits. SRAM cells have the advantageous feature of holding data without a need for refreshing. SRAM cells may include different numbers of transistors, and are often accordingly referred to by the number of transistors, for example, six-transistor (6T) SRAM, eight-transistor (8T) SRAM, and the like. The transistors typically form a data latch for storing a bit. Additional transistors may be added to control the access to the transistors. SRAM cells are typically arranged as an array having rows and columns. Typically, each row of the SRAM cells is connected to a word-line, which determines whether the current SRAM cell is selected or not. Each column of the SRAM cells is connected to a bit-line (or a pair of bit-lines), which is used for storing a bit into the SRAM cell or read from the SRAM cell.

With the scaling of integrated circuits, the operation voltages of integrated circuits are reduced, along with the operation voltages of memory circuits. Accordingly, read and write margins of the SRAM cells, which measure how reliably the bits of the SRAM cells can be read from and written into, respectively, are reduced. Due to the existence of static noise, the reduced read and write margins may cause errors in the respective read and write operations.

Figure 1:
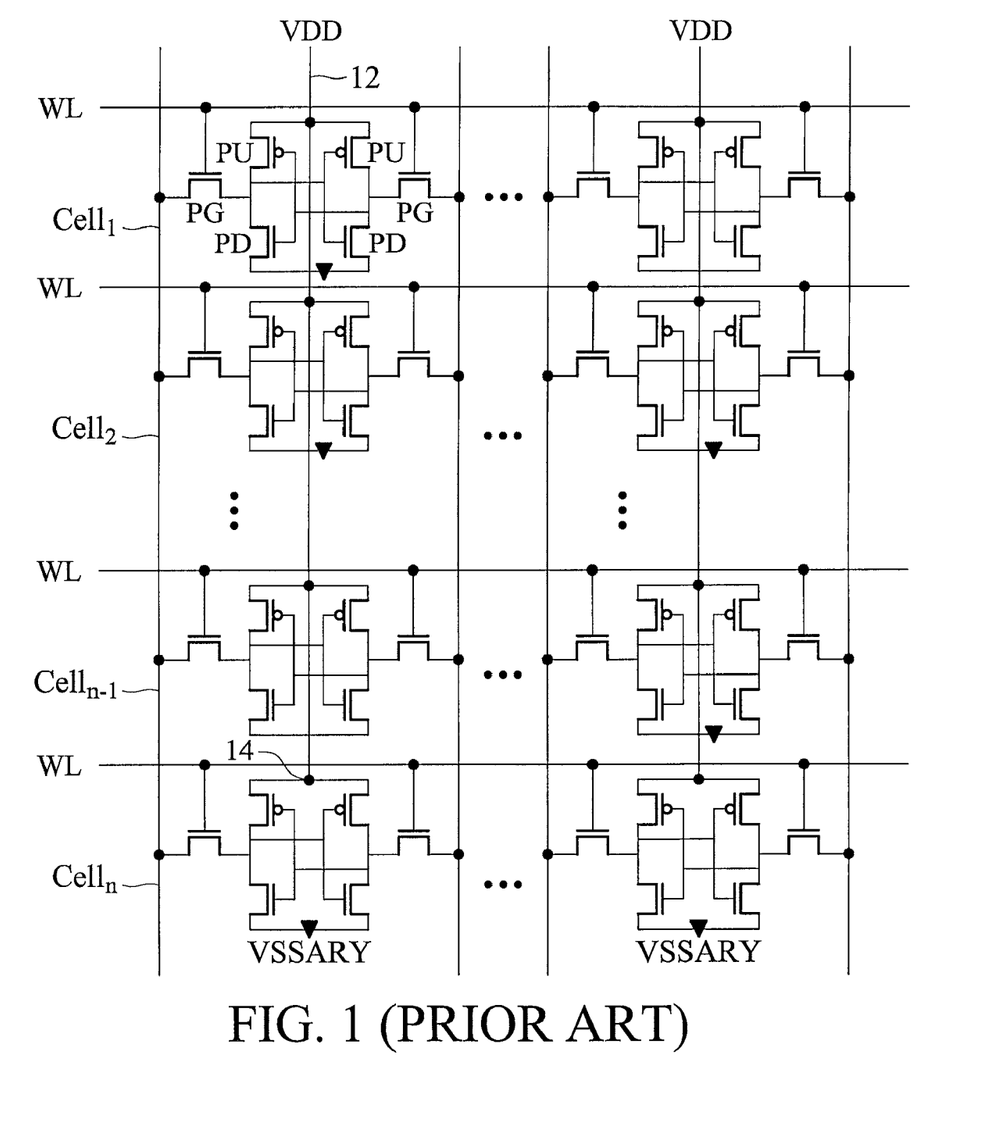
FIG. 1 illustrates a conventional static random access memory (SRAM) array.

FIG. 1 illustrates a portion of a conventional SRAM array, which includes a plurality of SRAM cells $cell_1$ through $cell_n$ in a same column. Power supply line 12 supplies power to SRAM cells $cell_1$ through $cell_n$. SRAM cell $cell_1$ is close to the starting point of the power supply line 12, which starting point is where the power supply line 12 receives power supply voltage VDD. SRAM cell $cell_n$ is close to the end point of the power supply line 12, at which the power supply line 12 terminates. In very small-scale integrated circuits, the power supply line 12 becomes very thin and narrow, and hence its resistance is no longer negligible. The power supply voltage provided to point 14 will thus be noticeably lower than supply voltage VDD due to the voltage drop on power supply line 12.

Conventionally, to improve the read and write margins, dynamic powers are provided, which means different power supply voltages VDD are provided for read and write operations. For example, the write margin can be improved by reducing the power supply voltage VDD during the write operations, while the read margin can be improved by increasing the power supply voltage VDD during the read operations. However, such a solution suffers from drawbacks when used in very small-scale integrated circuits. For example, when SRAM cell $cell_n$ is being written into, it drains current from, and hence causes instantaneous voltage drop on, power supply line 12. This is beneficial to the write operation as the write margin is improved. However, SRAM cell $cell_{n-1}$ is close to SRAM cell $cell_n$, and hence suffers from similar instantaneous voltage drop. Since the power supply line 12 already has the reduced voltage in the dual power scheme, the further instantaneous voltage drop may cause SRAM cell $cell_{n-1}$ to lose the bit value stored in, particularly if the bit value of SRAM cell $cell_{n-1}$ was previously weak. The same problem exists even in the single power scheme when the operation voltage goes into sub-1V territory.

Therefore, new SRAM arrays having improved read and write margins while at the same time overcoming the deficiency of the prior art are needed.

SUMMARY OF THE INVENTION

In accordance with one aspect of the present invention, a memory circuit includes a bit line; a word line; a first power supply node having a first power supply voltage; a first power supply line connected to the first power supply node; a second power supply node selected from a group consisting of a floating node and a node having a second power supply voltage lower than the first power supply voltage; a second power supply line configured to switch connections between the first and the second power supply nodes; a write-assist-keeper (WAK) device coupling the first and the second power supply lines; and a static random access memory (SRAM) cell connected to the bit line, the word line, and the second power supply line.

In accordance with another aspect of the present invention, a memory circuit includes a SRAM array, which includes a first plurality of power supply lines having a first power supply voltage extending in a column direction; a plurality of power supply nodes extending in the column direction, each selected from a group consisting of a floating node and a node having a second power supply voltage, wherein the second power supply voltage is lower than the first power supply voltage; a second plurality of power supply lines, each configured to switch connections between one of the first plurality of power supply lines and one of the plurality of power supply node; a plurality of bit lines extending in the column direction; a plurality of word lines extending in a row direction; a plurality of SRAM cells, each connected to one of the plurality of bit lines, one of the plurality of word lines, and one of the second plurality of power supply lines; and a plurality of write-assist-keeper (WAK) devices. Each of the WAK devices is coupled between one of the first plurality of power supply lines and one of the second plurality of power supply lines. Two neighboring WAK devices connected to a same one of the second plurality of power supply lines are separated by at least two SRAM cells.

In accordance with yet another aspect of the present invention, a method of operating a memory circuit includes providing a SRAM cell; providing a first power supply line having a first power supply voltage; providing a second power supply line; and providing a WAK device coupled between the first and the second power supply lines. The WAK device is adjacent the SRAM cell. The method further includes performing a read operation including connecting the second power supply line to the first power supply voltage; and reading from the SRAM cell. The method further includes performing a write operation including connecting the second power supply line to a power supply node selected from a group consisting of a floating node and a node having a second power supply voltage lower than the first power supply voltage; and writing into the SRAM cell.

In accordance with yet another aspect of the present invention, a method of operating a memory circuit includes providing a memory circuit, which includes a plurality of SRAM cells arranged as an array with rows and columns; a first plurality of power supply lines having a first power supply voltage, each being adjacent to one of the columns; a second plurality of power supply lines, each being adjacent to one of the columns and providing power to one of the columns of the array; and a plurality of WAK devices, each coupled between one of the first plurality of power supply lines and one of the second plurality of power supply lines. The plurality of WAK devices is substantially evenly distributed throughout the array. The method further includes performing a read operation to one (operation cell) of the plurality of SRAM cells including connecting one of the second plurality of power supply lines connected to the operation cell to the first power supply voltage; and reading from the operation cell. The method further includes performing a write operation including connecting the one of the second plurality of power supply lines connected to the operation cell to a power supply node selected from a group consisting of a floating node and a node having a second power supply voltage lower than the first power supply voltage; and writing into the operation cell.

The advantageous features of the embodiments of the present invention include improved Vccmin and reduced likelihood of losing data of memory cells to instantaneous voltage drop.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel static random access memory (SRAM) cell(s) array less affected by instantaneous voltage drop is provided. The variations and operations of the preferred embodiments are then discussed. Throughout the various views and illustrative embodiments of the present invention, like reference numbers are used to designate like elements.

Figure 2A:
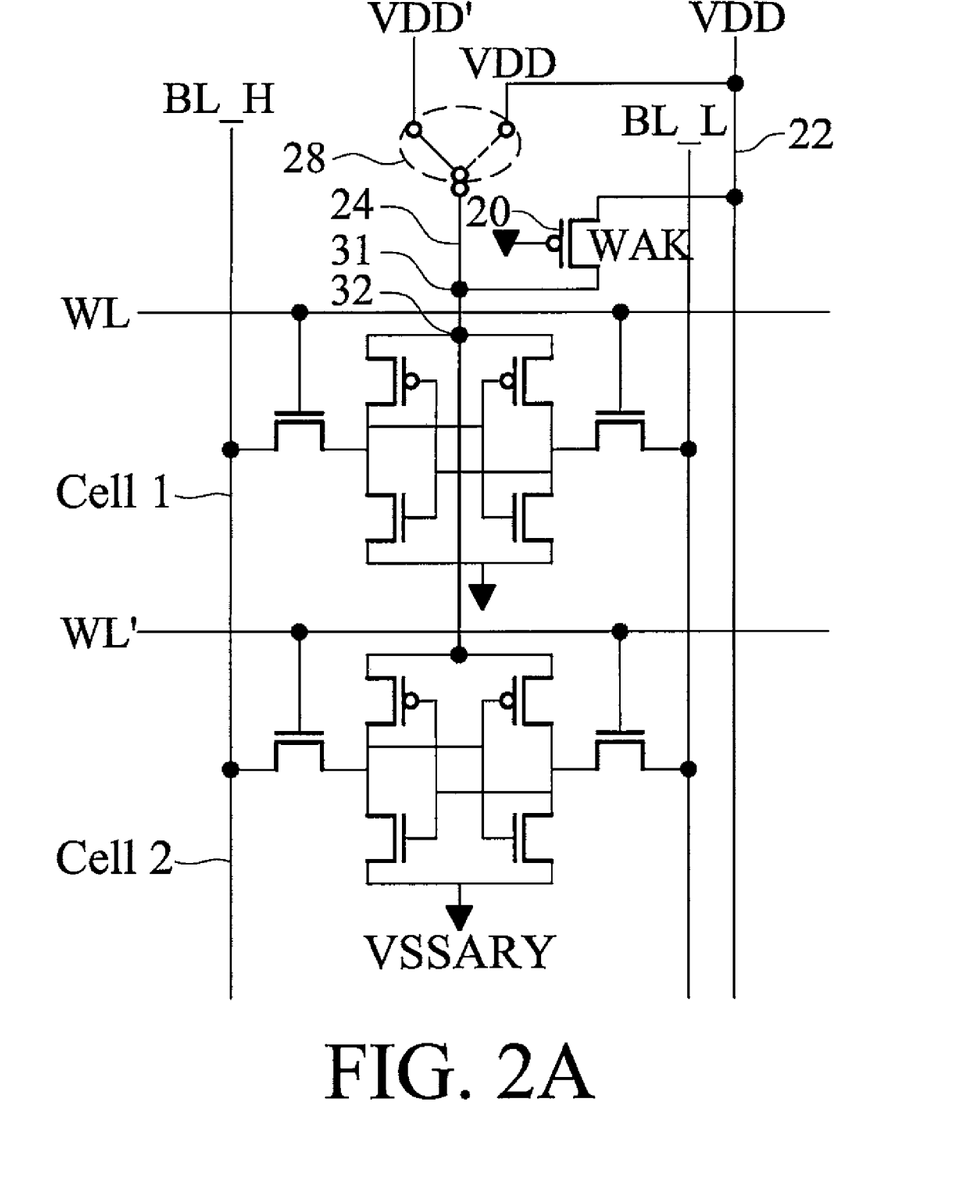
FIGS. 2A through 2D each illustrates a pair of SRAM cells sharing a write-assist-keeper (WAK) device, wherein in FIGS. 2A and 2B, the WAK devices are pMOS devices, while in FIGS. 2C and 2D, the WAK devices are nMOS devices.

FIG. 2A illustrates an embodiment of the present invention. SRAM cells Cell1 and Cell2 are grouped as a pair, and share a write-assist-keeper (WAK) device 20. Each of the SRAM cells Cell1 and Cell2 is connected to a word line, namely WL and WL', respectively. SRAM cells Cell1 and Cell2 also share a pair of bit lines BL_H and BL_L. In the following illustrated drawings, the SRAM cells each include six transistors (6T), however, the concept of the present invention is readily applicable to SRAM cells having different numbers of cells, such as 8T, 12T, etc.

In the preferred embodiment, WAK device 20 is a p-type metal-oxide-semiconductor (pMOS) transistor. In alternative embodiments, WAK device may be an n-type metal-oxide-semiconductor (nMOS) transistor, or other device or device group having a regulated current, as shown in FIGS. 2C and 2D. Preferably, WAK device 20 is conductive when supply voltages are provided. Therefore, in the embodiment shown in FIGS. 2A and 2B, the gate of WAK device 20 is connected to VSS (or ground), or other voltages low enough to allow WAK device 20 to conduct. In other embodiments, the gate of WAK device 20 may be connected to a non-constant voltage, so that the current flowing through WAK device 20 may increase when the source-drain voltage difference of the WAK device 20 increases.

The source of WAK device 20 is connected to power supply line 22, which is further connected to (power) supply voltage VDD. The drain of WAK device 20 is connected to another power supply line 24. Power supply line 24 is further connected to switch 28. In an embodiment as shown in FIG. 2A, switch 28 switches between supply voltage VDD and an additional (power) supply voltage VDD', which is lower than supply voltage VDD. Preferably, the magnitude of the supply voltage VDD is suitable for the read operations of SRAM cells Cell1 and Cell2 with adequate read margins, while the magnitude of the supply voltage VDD' is suitable for the write operations of the SRAM cells Cell1 and Cell2 with adequate write margins.

An exemplary read operation is described as follows. Assuming SRAM cell Cell1 is to be read from, during the read operation, switch 28 is switched to supply voltage VDD. Accordingly, with a short distance between switch 28 and node 32, the voltage drop on power supply line 24 is negligible. The supply voltage at node 32 is thus about VDD, which provides a desirable read margin. In a write operation, switch 28 is switched to supply voltage VDD'. At this time, the voltage at node 32 is affected by both power supply voltages VDD and VDD', and the resulting voltage at node 32 will be between power supply voltages VDD and VDD'. This advantageously improves the write margins in write operations.

Preferably, the WAK device 20 is a weak device with limited current. With the insignificant source-drain voltage (VDD-VDD'), it has limited ability to pull the voltage at node 32 up to supply voltage VDD. Accordingly, the voltage at node 32 is mainly affected by supply voltage VDD'. In an exemplary embodiment, WAK device 20 has a W/L ratio (the ratio of channel width to channel length) being around 1 or 2 times that of the p-load in the 6T/8T cell.

Figure 2B:
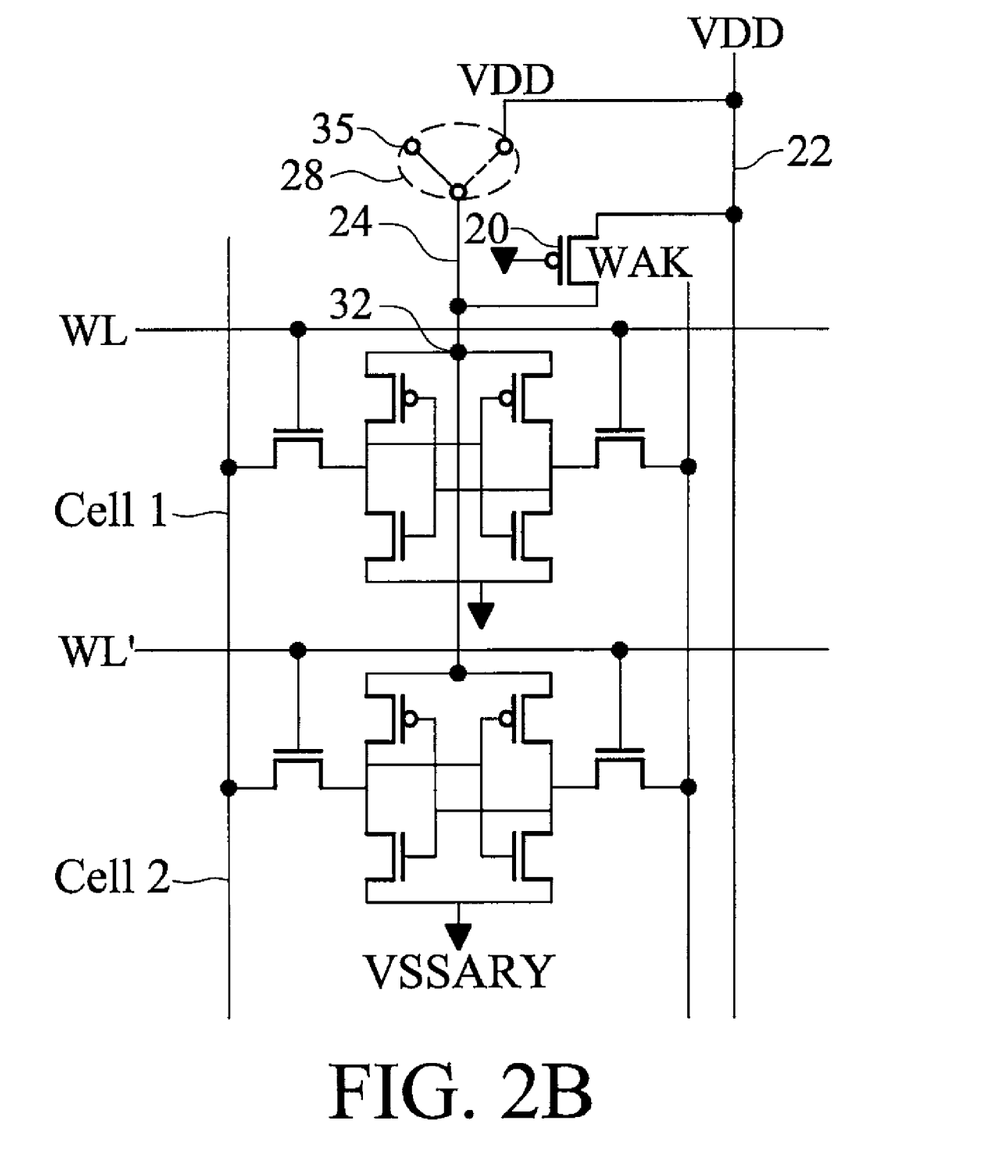
Figure 2C:
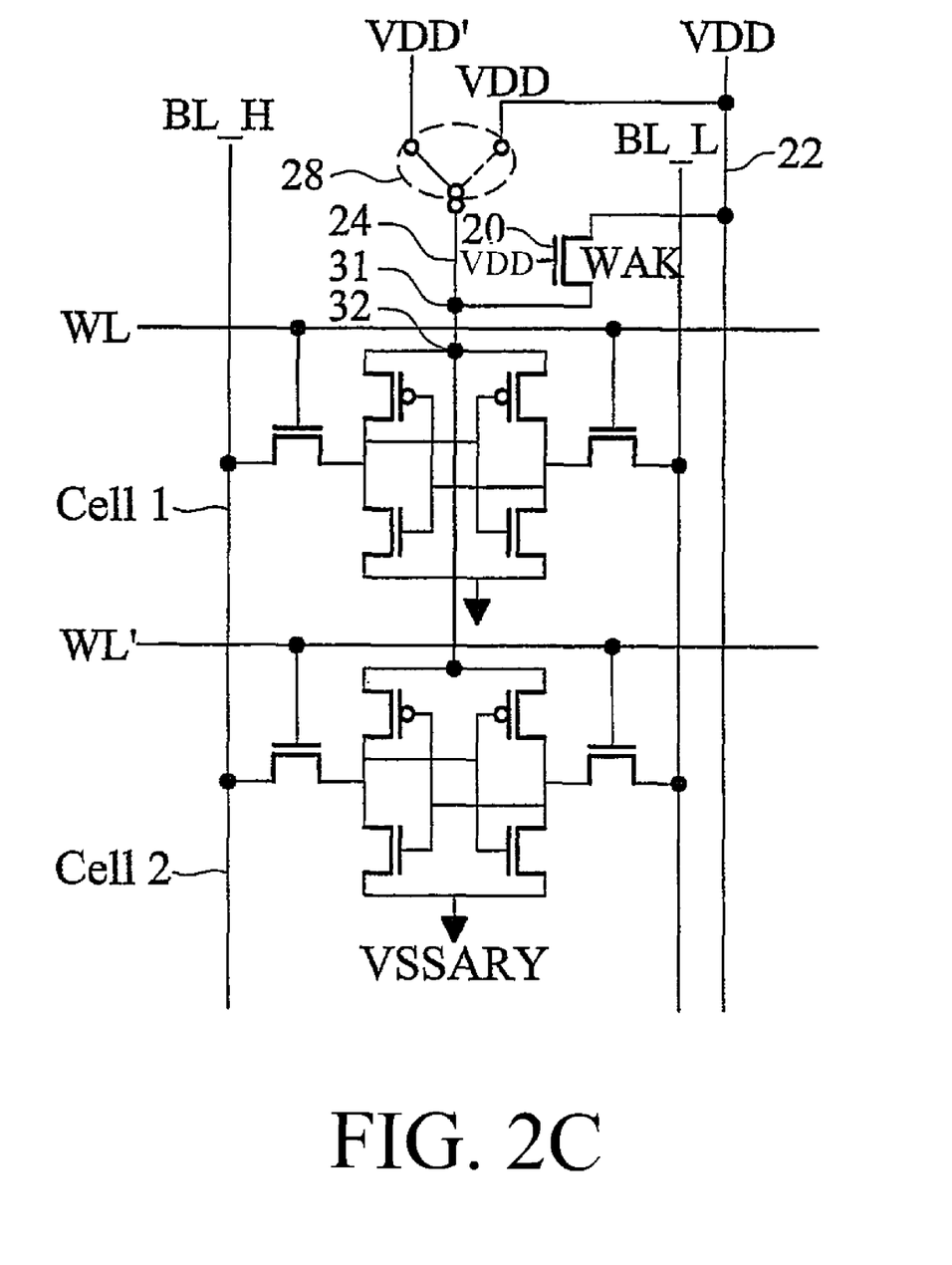
Figure 2D:
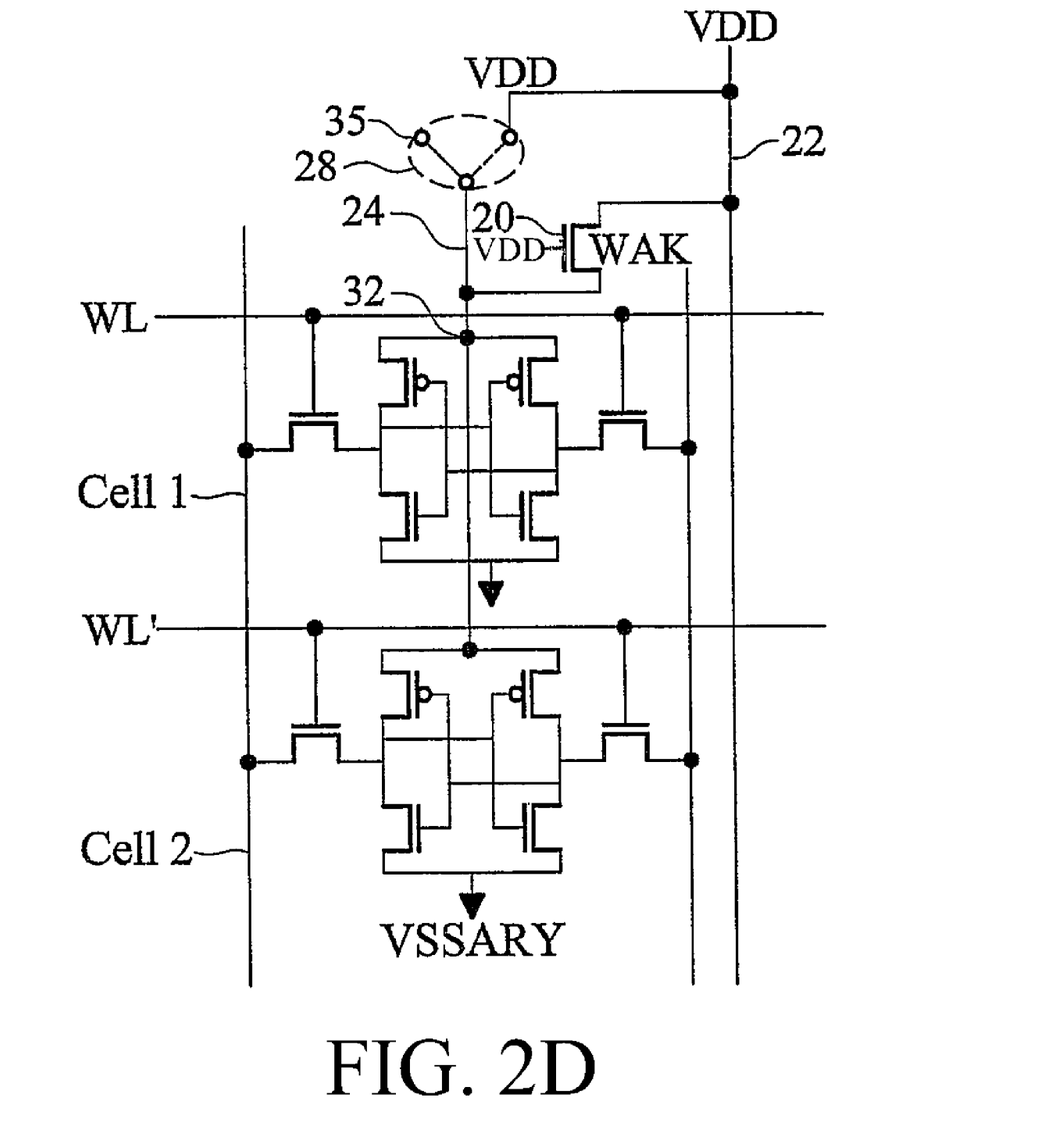

In alternative embodiments as shown in FIG. 2B, switch 28 switches the power supply line 24 between supply voltage VDD and floating node 35. During read operations, switch 28 is connected to supply voltage VDD, so that the read margin is improved. During write operations, switch 28 is connected to floating node 35, and hence power supply line 24 is connected to supply voltage VDD through WAK device 20. When a write operation is performed on SRAM cell Cell1, it drains current from power supply line 24. Since WAK device 20 is weak and cannot supply the current needed for the cell to switch, the voltage at node 32 drops instantaneously. Accordingly, the write operation benefits from the instantaneous voltage-drop, and hence the write margin is improved.

Figure 3A:
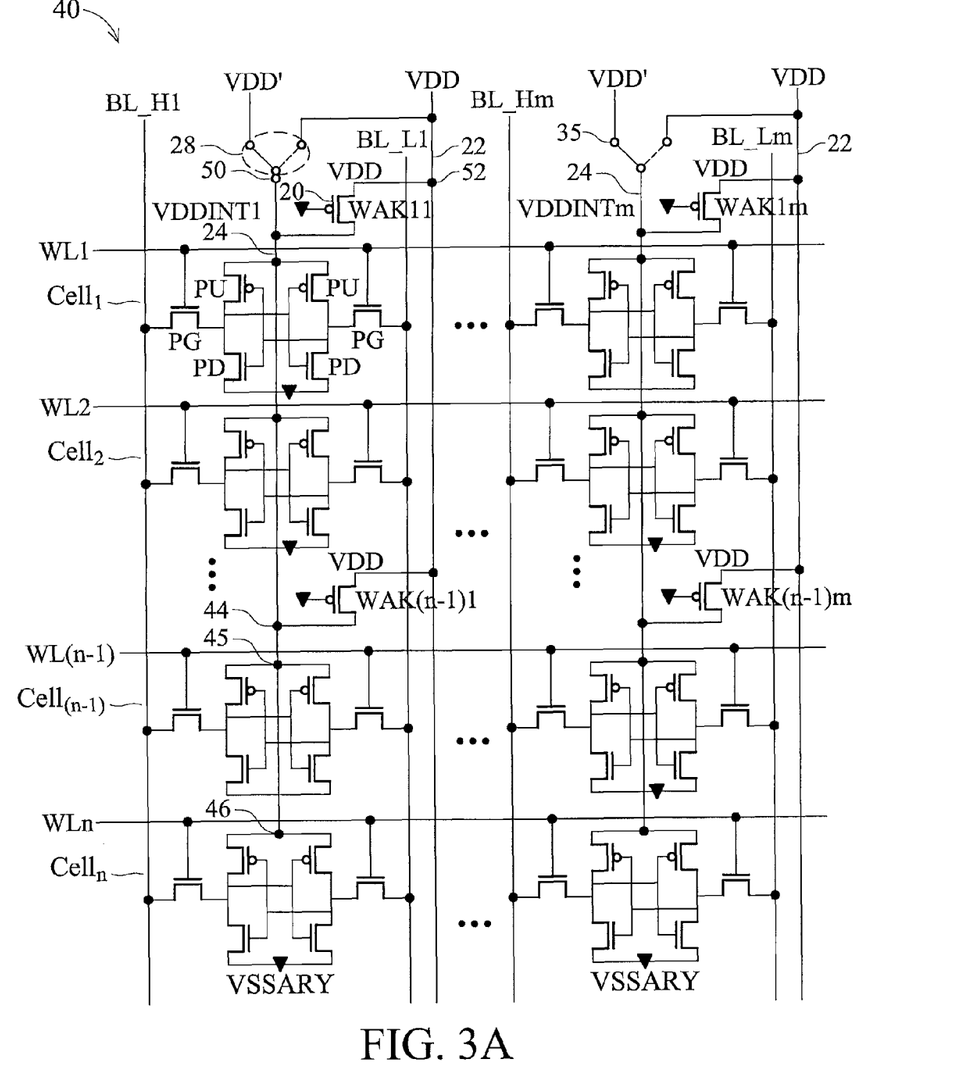
FIGS. 3A and 3B illustrate SRAM arrays having a plurality of WAK devices, each shared by two SRAM cells.

FIG. 3A illustrates SRAM array 40, which includes a plurality of SRAM cells, and a plurality of WAK devices shared by the SRAM cells. On average, a ratio of the total number of SRAM cells in array 40 to the total number of WAK devices 20 in array 40 is preferably two, and hence the SRAM cells of the preferred embodiment may also be referred to as 6.5T cells. However, the ratio may be other integers greater than two, such as three, four, or the like. Throughout the description, two or more SRAM cells in a same column neighboring a WAK device 20 is referred to as "sharing" a WAK device. However, it is realized since all WAK devices in a same column are connected to a same power supply line 24, the concept of "sharing" is in the context of the isolation of instantaneous voltage drop, wherein the isolation means the instantaneous voltage drop view by other SRAM cells are noticeably smaller than at the SRAM cell being written into due to the resistances of power supply lines 22 and 24. The further a SRAM cell is from the source of the instantaneous voltage drop, the greater the isolation effect will be.

SRAM array 40 includes m columns and n rows of SRAM cells, wherein the respective word lines WL and bit lines BL_H and BL_L are referred to by their respective row and column numbers. In the following discussions, the cells in the first column are referred to using their respective row numbers, namely Cell1 through Celln. Each of the power supply lines 22 is connected to the power supply voltage VDD. All power supply lines 24 are connected to power supply voltage VDD' (or floating node 35), and extend in the column direction. Power supply lines 22 and 24 both connect to the power supply voltages VDD, VDD' (or floating node) at a same column end. For example, in FIG. 3A, power supply lines 22 and 24 are all connected at the top end, and terminate at the bottom end.

Due to the resistances of power supply lines 22 and 24, supply voltages received by SRAM cells Cell through Celln drop from the top end to the bottom end of power supply lines 22 and 24. Accordingly, longer power supply lines 22 and 24 mean greater voltage drops. The row number n thus affects the performance of SRAM array 40. In an exemplary embodiment, row number n is about 128.

The voltages V45 at node 45 and voltage V46 at node 46 are the lowest since they are close to the terminating point of the power supply line 24. The voltage V48 at node 48 is also low due to the voltage drop on power supply line 22. Assuming power supply lines 22 and 24 have a same width, then if voltage V44 to voltage V50 (at node 50) has a first ratio, and voltage V46 to voltage V52 (at node 52, assume it equals to VDD) has a second ratio, the first ratio will be substantially the same as the second ratio.

The operations of SRAM cell Cell1 and other cells close to switch 28 are substantially the same as the cells illustrated in FIGS. 2A and 2B, and have been described in the preceding paragraphs. The operations of SRAM cell Cell(n-1) and Celln and other cells far away from switch 28, however, are different due to the instantaneous voltage drops on power supply lines 22 and 24.

For simplicity purpose, in the subsequent discussion, it is assumed that the voltage drop on the portion of power supply line 24 between node 50 and node 44 is dV1, and the voltage drop on the portion of power supply line 22 between node 52 and node 48 is dV2, then voltage V44 is V50-dV1, and voltage V48 is V52-dV2. Please note voltages drops dV1 and dV2 may be slightly different if the voltages V50 and V52 are different, and/or power supply lines 22 and 24 have different widths. However, the difference between voltage drops dV1 and dV2 is unlikely to affect the memory operations. Therefore, both voltages drops dV1 and dV2 are referred to as dV.

During a read operation of SRAM cell Celln, power supply line 24 is switched to VDD, and hence voltages V50 and V52 are both VDD. Therefore, voltages V44 and V46 are both VDD-dV. Since node 46 is very close to node 44, and hence the voltage drop between nodes 44 and 46 is negligible, voltage V46, which is the supply voltage to SRAM cell Celln, is also about VDD-dV. This voltage is great enough for SRAM cells Cell(n-1) and Celln to retain data.

During a write operation of SRAM cell Celln, power supply line 24 is switched to VDD', and hence voltage V50 is VDD', while voltage V52 is VDD. Therefore, voltage V46 (before WAK devices WAK31 through WAK(n-1)1 are taken into consideration) is about VDD'-dV. Since node 46 is very close to node 44, and hence the voltage drop between nodes 44 and 46 is negligible, voltage V46, which is the supply voltage to SRAM cell Celln, is affected by both VDD'-dV and VDD-dV, and will be at an intermediate value, denoted as VDD". The writing of SRAM cell Celln drains current from power supply line 24, causing instantaneous voltage drop at node 46. The voltage V46 will thus drop below voltage VDD". This is beneficial for improving the write margin for write operations. SRAM cell Cell(n-1), on the other hand, is protected by WAK device WAK31, which pulls up the voltage at node 45. It is realized that the current flowing through WAK device WAK 31 is related to the voltage difference between voltage V48 and V45. Therefore, if voltage 45 drops more, more pull up is provided by WAK device WAK 31. Accordingly, WAK device WAK 31 prevents the voltage at node 45 from dropping too low, and hence the datum in SRAM cell Cell(n-1) is retained.

It is realized that other devices further away from SRAM cell Celln, such as SRAM cells Cell(n-2) and Cell(n-3) (not shown), are isolated more from SRAM cell Celln due to greater distances (and hence greater resistances) between them and SRAM cell Celln. Accordingly, their respective WAK devices may provide SRAM cells Cell(n-2) and Cell(n-3) with more protection from the instantaneously voltage drop. This is partially due to the resistance that prevents the voltage supplies of the SRAM cells to immediately follow the instantaneous voltage drop.

Figure 3B:
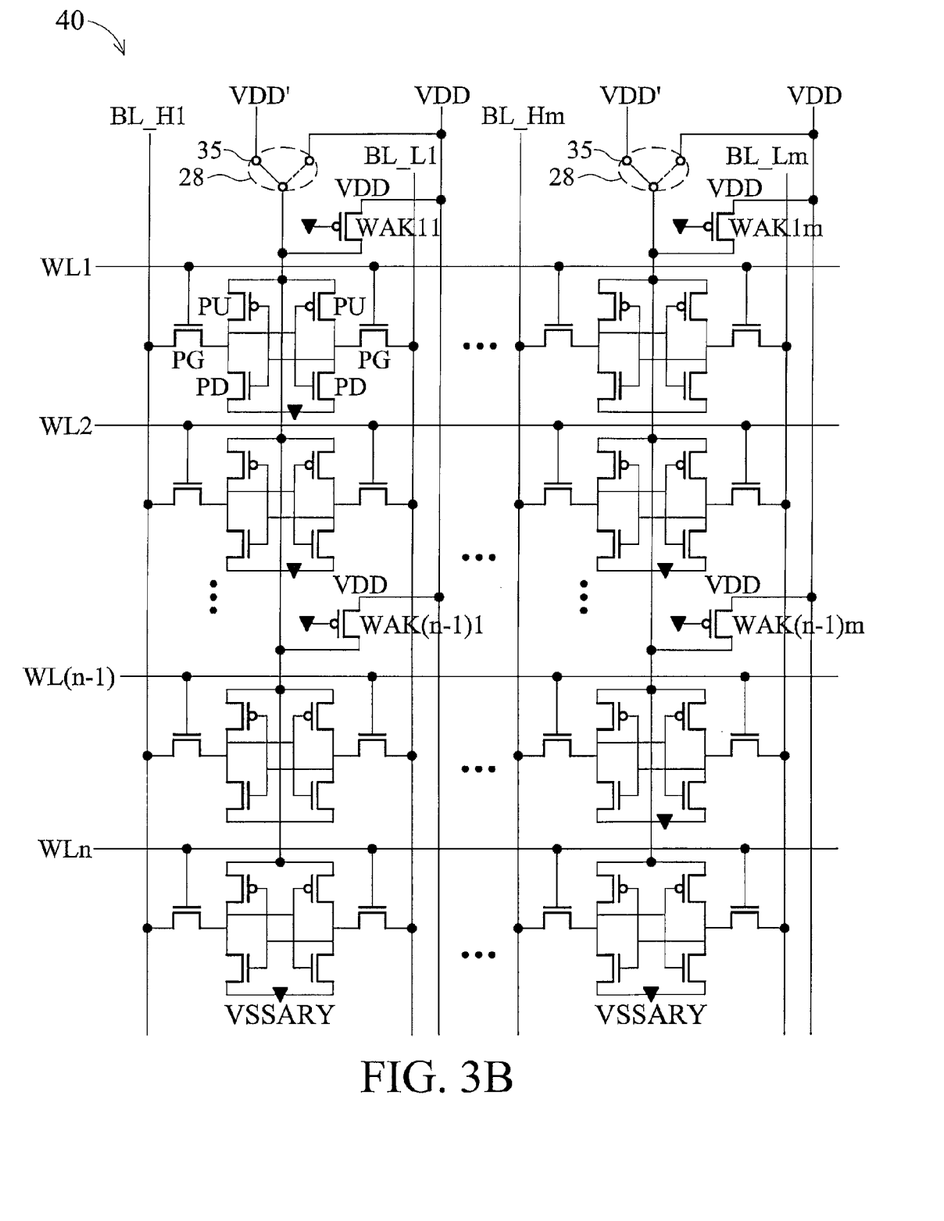

Even if switch 28 switches to a floating node, as is shown in FIG. 3B, the protection to the unwritten SRAM cells from the instantaneous voltage drop still exists. However, if switch 28 switches between a floating node and VDD, for both read and write operations, the voltage V46, at a time just before the write operation starts, will be VDD-dV instead of the intermediate voltage VDD".

The above-discussed example, in which a write operation is performed on the last SRAM cell Celln in the respective column, is a worst-case scenario. In this scenario, since the voltage drop dV is greatest, a cell close to Celln suffers both voltage drop dV and the instantaneous voltage drop, and is most likely to have a supply voltage lower than needed for data retention. If the write operation is performed to any other SRAM cells between Cell1 and Celln, since the voltage drop dV is smaller, the neighboring cells will have a greater margin for the data retention.

Figure 4A:
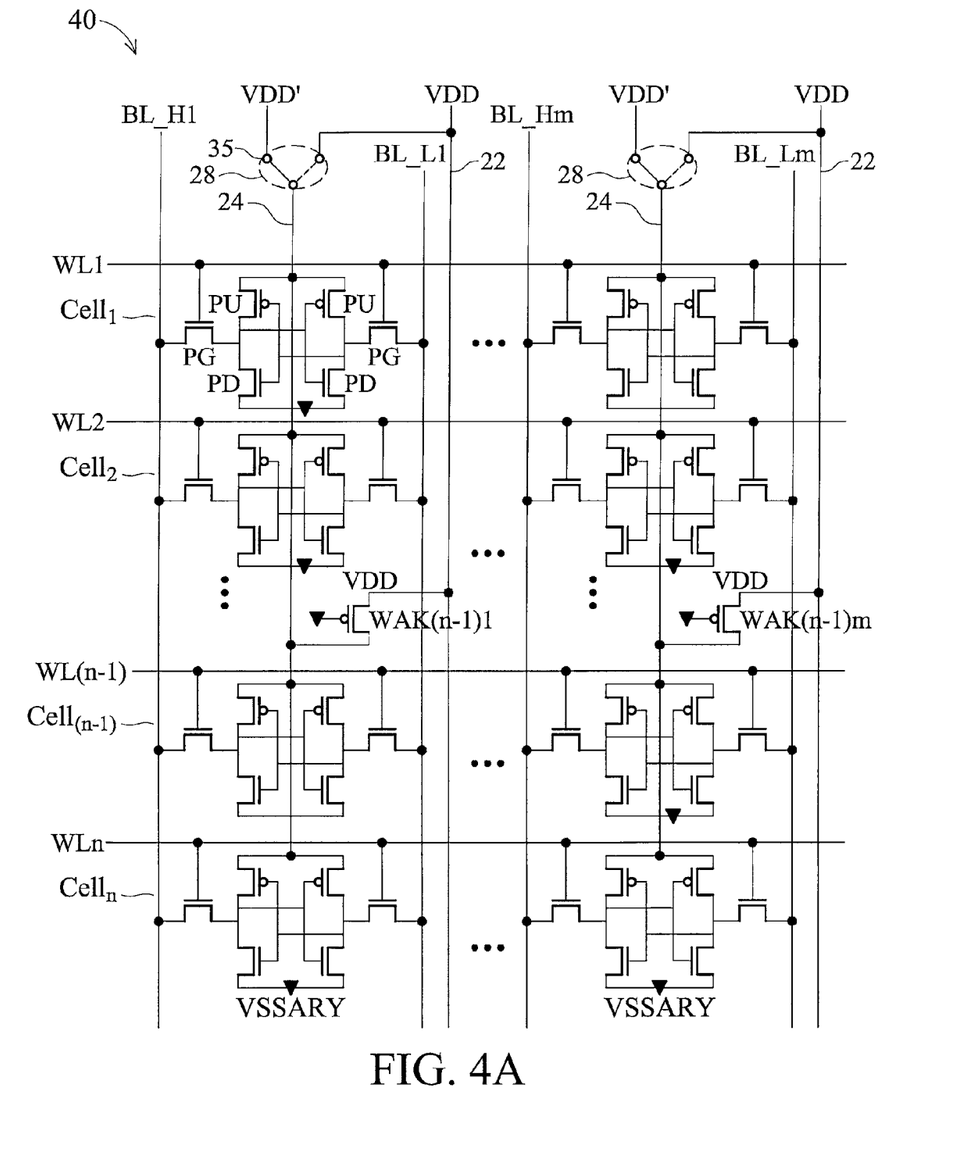
FIGS. 4A and 4B illustrate SRAM arrays having a plurality of WAK devices, each shared by four SRAM cells.
Figure 4B:
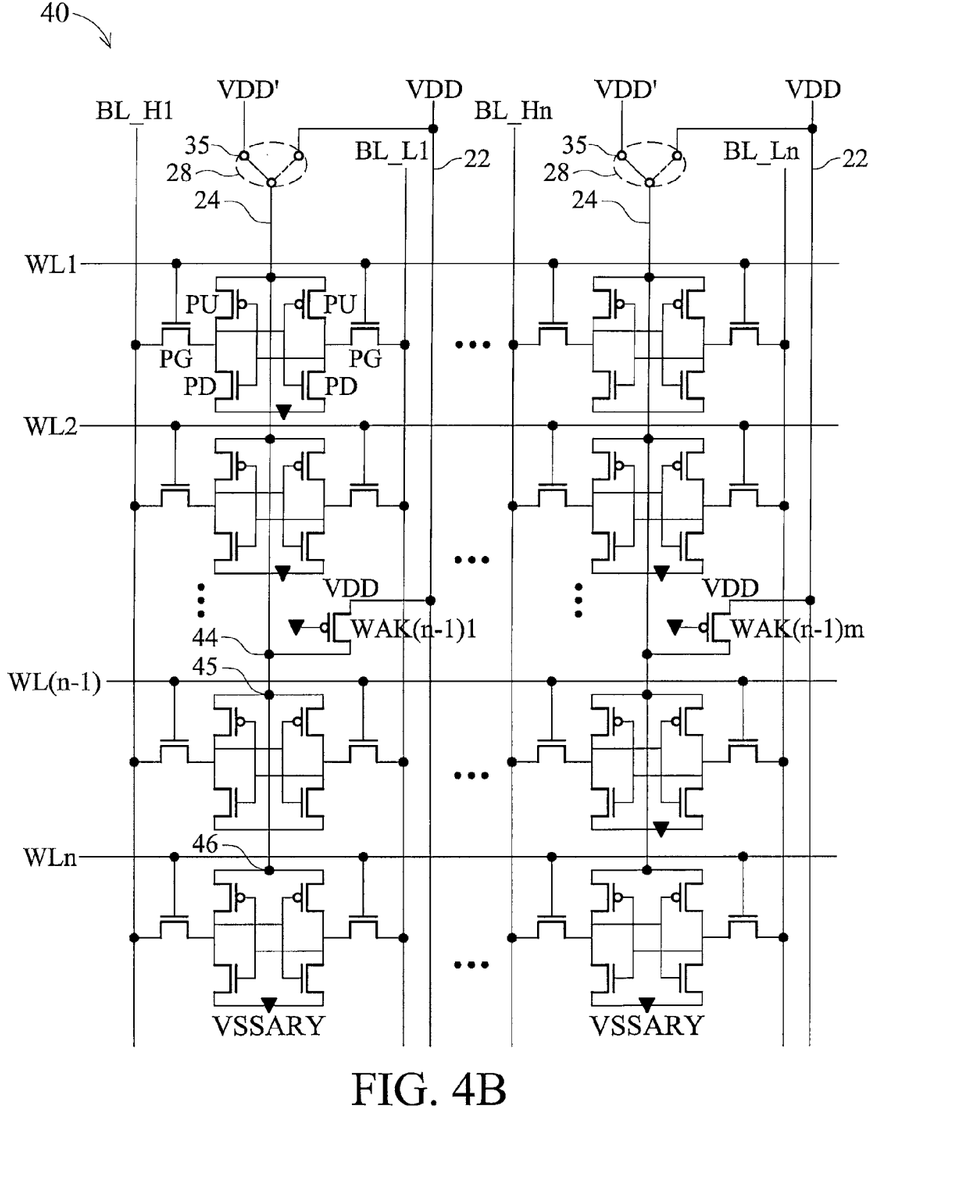

FIG. 4A illustrates another embodiment, in which on average, four SRAM cells share a WAK device. In yet other embodiments, a WAK device may be shared by more than four SRAM cells. With more SRAM cells sharing one WAK device, the cost per cell is reduced. It is to be realized, however, that a tradeoff exists between the cost and the effectiveness in protecting unwritten cells from instantaneous voltage drops. With more SRAM cells sharing one WAK device, the distance between a WAK device and the SRAM cells it protects is prolonged, and hence the resistances therebetween increases, which in turn weakens the protection ability. FIG. 4B illustrates another embodiment similar to what is shown in FIG. 4A, except switches 28 are connected to floating node 35 during write operations.

Figure 5:
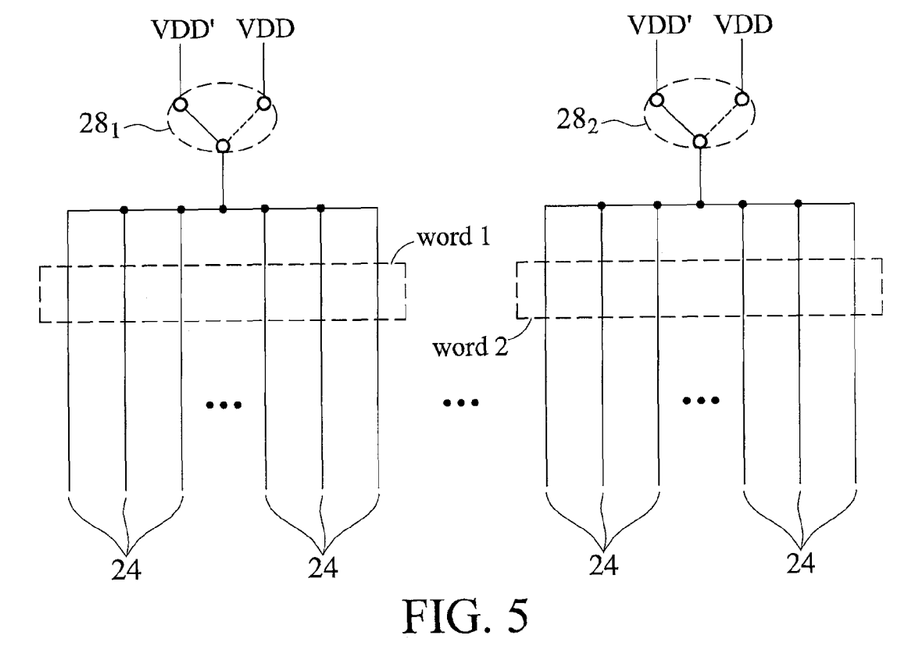
FIG. 5 illustrates power supply lines in a memory array are grouped into different groups disconnected from each other.

FIG. 5 illustrates a connection scheme of power supply lines 24. The power supply lines 24 whose connecting SRAM cells are grouped into a same word (for example, word 1) may share a same switch $28_1$. Other power supply lines 24 whose connecting memory cells are grouped into a different word (for example, word 2) may share another switch $28_2$, which may be switched independent from switch $28_1$. Power supply lines 24 connected to switch $28_1$ are disconnected from power supply lines 24 connected to switch $28_2$. This way, the parasitic capacitance connected to a switch 28 will not be too great to act as a parasitic power supply.

The embodiments of the present invention have several advantageous features. First, with SRAM cells receiving different supply voltages for read and write operations, the read margin and write margin are both increased. Accordingly, the VCCMIN is improved. Second, with WAK devices protecting SRAM cells from losing data to instantaneous voltage drops, lower power supply voltages and narrower power supply lines may be adopted, allowing the SRAM array to be manufactured by smaller-scale technologies.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A memory circuit comprising:
   a bit line;
   a first word line;
   a second word line adjacent the first word line;
   a first power supply node having a first power supply voltage;
   a first power supply line connected to the first power supply node;
   a second power supply node selected from a group consisting of a floating node and a node having a second power supply voltage lower than the first power supply voltage;
   a second power supply line configured to switch connections between the first and the second power supply nodes;
   a write-assist-keeper (WAK) device coupling the first and the second power supply lines;
   an additional WAK device coupled between the first and the second power supply lines;
   a first static random access memory (SRAM) cell connected to the bit line, the first word line, and the second power supply line; and
   a second SRAM cell connected to the bit line, the second word line, and the second power supply line.

2. The memory circuit of claim 1, wherein the second power supply line is parallel to the bit line,
   wherein the WAK device, the first SRAM cell, the second SRAM cell, and the additional WAK device are connected to the second power supply line at a first, a second, a third, and a fourth point, respectively, and wherein the second and the third points are between the first and the fourth points, and wherein no WAK device is connected between the first and the fourth points.

3. The memory circuit of claim 1, wherein the WAK device is a pMOS transistor having a source coupled to the first power supply line, a drain coupled to the second power supply line, and a gate coupled to a low voltage node.

4. The memory circuit of claim 3, wherein the low voltage node is grounded.

5. The memory circuit of claim 1, wherein the WAK device is an nMOS transistor having a drain and a gate coupled to the first power supply line, and a source couple to the second power supply line.

6. The memory circuit of claim 1 further comprising a switch for switching the connections of the second power supply line between the first and the second power supply nodes.

7. The memory circuit of claim 1, wherein the second power supply node is connected to the second power supply voltage.

8. A memory circuit comprising:
   a static random access memory (SRAM) array comprising:
     a first plurality of power supply lines having a first power supply voltage extending in a column direction;
     a plurality of power supply nodes extending in the column direction, each selected from a group consisting of a floating node and a node having a second power supply voltage, wherein the second power supply voltage is lower than the first power supply voltage;
     a second plurality of power supply lines, each configured to switch connections between one of the first plurality of power supply lines and one of the plurality of power supply nodes;
     a plurality of bit lines extending in the column direction;
     a plurality of word lines extending in a row direction;
     a plurality of SRAM cells, each connected to one of the plurality of bit lines, one of the plurality of word lines, and one of the second plurality of power supply lines; and
     a plurality of write-assist-keeper (WAK) devices, each coupled between one of the first plurality of power supply lines and one of the second plurality of power supply lines, wherein two neighboring WAK devices connected to a same one of the second plurality of power supply lines are separated by at least two SRAM cells.

9. The memory circuit of claim 8, wherein the first and the second plurality of power supply lines terminate at a same column end.

10. The memory circuit of claim 8, wherein the two neighboring WAK devices connected to the same one of the second plurality of power supply lines are separated by only two SRAM cells.

11. The memory circuit of claim 8, wherein the two neighboring WAK devices connected to the same one of the second plurality of power supply lines are separated by at least four SRAM cells.

12. The memory circuit of claim 8, wherein each of the plurality of WAK devices is a pMOS transistor having a gate grounded.

13. The memory circuit of claim 8, wherein each of the plurality of WAK devices is an nMOS transistor.

14. The memory circuit of claim 8, wherein the second plurality of power supply lines have the second power supply voltage.

15. The memory circuit of claim 8, wherein the plurality of power supply nodes is floating nodes.

16. The memory circuit of claim 8, wherein the second plurality of power supply lines comprises a first group and a second group disconnected from each other, wherein power supply lines in the first group are interconnected, and power supply lines in the second group are interconnected, and wherein SRAM cells receiving power from the first group and SRAM cells receiving power from the second groups are in different words.

17. The memory circuit of claim 8, wherein a total number of SRAM cells in the array and a total number of WAK devices in the array have a ratio equal to an even integer no less than two.

18. A method of operating a memory circuit, the method comprising:
providing a static random access memory (SRAM) cell;
providing a first power supply line having a first power supply voltage;
providing a second power supply line;
providing a write-assist-keeper (WAK) device coupled between the first and the second power supply lines, wherein the WAK device is adjacent the SRAM cell;
providing an additional WAK device coupled between the first and the second power supply lines, wherein the WAK device is further from the SRAM cell than the WAK device;
performing a read operation comprising:
connecting the second power supply line to the first power supply voltage; and
reading from the SRAM cell; and
performing a write operation comprising:
connecting the second power supply line to a power supply node selected from a group consisting of a floating node and a node having a second power supply voltage lower than the first power supply voltage; and
writing into the SRAM cell.

19. The method of claim 18, wherein during the step of performing the write operation, the second power supply line is connected to the second power supply voltage.

20. The method of claim 18, wherein during the step of performing the write operation, the second power supply line is connected to the floating node.

21. The method of claim 18, wherein the SRAM cell shares the WAK device with an additional SRAM device, and wherein the additional SRAM device is immediately neighboring the SRAM cell and connected to the second power supply line.

22. A method of operating a memory circuit, the method comprising:
providing the memory circuit comprising:
a plurality of static random access memory (SRAM) cells comprising more than one SRAM cell and arranged as an array with rows and columns;
a first plurality of power supply lines having a first power supply voltage, each being adjacent to one of the columns;
a second plurality of power supply lines, each being adjacent to one of the columns and providing power to one of the columns of the array;
a plurality of write-assist-keeper (WAK) devices, each coupled between one of the first plurality of power supply lines and one of the second plurality of power supply lines, wherein the plurality of WAK devices is substantially evenly distributed throughout the array, and wherein at least two of the plurality of WAK devices are connected to a same one of the columns of the array;
performing a read operation to one (operation cell) of the plurality of SRAM cells comprising:
connecting one of the second plurality of power supply lines connected to the operation cell to the first power supply voltage; and
reading from the operation cell; and
performing a write operation comprising:
connecting the one of the second plurality of power supply lines connected to the operation cell to a power supply node selected from a group consisting of a floating node and a node having a second power supply voltage lower than the first power supply voltage; and
writing into the operation cell.

23. The method of claim 22, wherein the second plurality of power supply lines are grouped into a plurality of groups disconnected from each other, and wherein power supply lines in a same one of the plurality of groups are interconnected, and power supply lines in different ones of the plurality of groups are disconnected from each other.

24. The method of claim 23, wherein power supply lines in a same one of the plurality of groups supply power to a same word of the array.

25. The method of claim 22, wherein a ratio of a total number of the plurality of SRAM cells in the array to a total number of the plurality of WAK devices is equal to an integer no less than two.

26. The method of claim 22, wherein during the step of performing the write operation, the one of the second plurality of power supply lines connected to the operation cell is connected to the second power supply voltage.

27. The method of claim 22, wherein during the step of performing the write operation, the one of the second plurality of power supply lines connected to the operation cell is connected to the floating node.

* * * * *